(12) United States Patent
Metzler et al.

(10) Patent No.: US 11,615,219 B2
(45) Date of Patent: Mar. 28, 2023

(54) METHOD OF GENERATION OF AN ENHANCED PLANT MODEL

(71) Applicant: HEXAGON TECHNOLOGY CENTER GMBH, Heerbrugg (CH)

(72) Inventors: Bernhard Metzler, Dornbirn (AT); Nils Van Heijnsbergen, Ratingen (DE)

(73) Assignee: HEXAGON TECHNOLOGY CENTER GMBH, Heerbrugg (CH)

(*) Notice: Subject to any disclaimer, the term of this patent is extended or adjusted under 35 U.S.C. 154(b) by 415 days.

(21) Appl. No.: 16/434,078

(22) Filed: Jun. 6, 2019

(65) Prior Publication Data
US 2019/0377836 A1 Dec. 12, 2019

(30) Foreign Application Priority Data
Jun. 7, 2018 (EP) .................................... 18176653

(51) Int. Cl.
*G06F 30/13* (2020.01)
*G06F 30/18* (2020.01)

(52) U.S. Cl.
CPC .............. *G06F 30/13* (2020.01); *G06F 30/18* (2020.01)

(58) Field of Classification Search
CPC ................................ G06F 30/13; G06F 30/18
USPC .............................................................. 703/1
See application file for complete search history.

(56) References Cited

U.S. PATENT DOCUMENTS

| | | | |
|---|---|---|---|
| 10,395,427 B1* | 8/2019 | Cote | G06T 7/75 |
| 2007/0132779 A1* | 6/2007 | Gilbert | G05B 19/41885 |
| | | | 345/619 |
| 2009/0292514 A1* | 11/2009 | McKim | G06F 30/20 |
| | | | 703/6 |
| 2010/0315416 A1* | 12/2010 | Pretlove | G06T 7/33 |
| | | | 345/419 |
| 2012/0069051 A1 | 3/2012 | Hagbi et al. | |
| 2015/0120251 A1* | 4/2015 | Kim | G06K 9/00201 |
| | | | 703/1 |
| 2015/0302650 A1 | 10/2015 | Abdelmoati et al. | |
| 2016/0275703 A1 | 9/2016 | Mariampillai et al. | |
| 2017/0061031 A1* | 3/2017 | Jammikunta | G06F 16/172 |

(Continued)

FOREIGN PATENT DOCUMENTS

EP 3 136 322 A1 3/2017

OTHER PUBLICATIONS

Son et al. "3D reconstruction of as-built industrial instrumentation models from laser-scan data and a 3D CAD database based on prior knowledge" (Year: 2014).*

(Continued)

*Primary Examiner* — Brian S Cook
(74) *Attorney, Agent, or Firm* — Maschoff Brennan

(57) ABSTRACT

A method of generating an information enhanced model of an industrial plant. The method includes providing a first digitalized topology of a plant by processing a spatial scan of the plant, wherein in course of the processing, plant structural elements and their interconnections are recognized and digitalized, providing a second digitalized topology of the plant, based on a process and instrumentation diagram, the second topology being representative of plant structural elements and their interconnections, and correlating the first and the second digitalized topology by at least semi-automatically identifying and interlinking corresponding structural elements in the first and second digitalized topology.

15 Claims, 7 Drawing Sheets

(56) References Cited

U.S. PATENT DOCUMENTS

| | | |
|---|---|---|
| 2017/0076500 A1 | 3/2017 | Maggiore et al. |
| 2017/0323481 A1 | 11/2017 | Tran et al. |
| 2018/0131907 A1* | 5/2018 | Schmirler .......... G05B 23/0216 |
| 2018/0330028 A1* | 11/2018 | Nutt ........................ G06F 30/18 |
| 2019/0073827 A1* | 3/2019 | Coronado ................ H04Q 9/00 |
| 2020/0050181 A1* | 2/2020 | McDaniel .............. G05B 17/02 |

OTHER PUBLICATIONS

"Advanced Process Display and Multimedia Technologies for Optimizing Power Plant Control", ABB Review, ABB ASEA Brown Boveri, pp. 27-32 (Jan. 1, 1993).

Lei, H., et al., "Combining Photogrammetry and Augmented Reality Towards an Integrated Facility Management System for the Oil Industry", Proceedings of the IEEE, IEEE, vol. 102, No. 2, pp. 204-220 (Feb. 1, 2014).

Extended European Search Report dated Nov. 9, 2018 as received in Application No. 18176653.6.

* cited by examiner

METHOD OF GENERATION OF AN ENHANCED PLANT MODEL

CROSS-REFERENCE TO RELATED APPLICATIONS

This application claims priority to European Patent Application No. 18176653, filed on Jun. 7, 2018. The foregoing patent application are incorporated herein by reference.

FIELD OF INVENTION

The present invention relates to a method of and computer program product for generation of an information enhanced model of an industrial plant.

BRIEF DESCRIPTION

Some embodiments of the present invention relate to a method of generation of an information enhanced model of an industrial plant, the method comprising the steps of providing a first digitalized topology of the plant by processing a spatial or three-dimensional (3D) scan of the plant, wherein in course of the processing plant structural elements and their interconnections are recognized and digitalized, providing a second digitalized topology of a plant, based on a process and instrumentation diagram (PID), the second topology being representative of plant structural elements and their interconnections, wherein the second digitalized topology is provided in a digitalized form assimilable to the first topology, and at least semi-automatically identifying and interlinking corresponding structural elements in the first and second digitalized topology and correlating the first and the second digitalized topology.

In other words, two digitalized topologies of the plant, one based on a spatial scan like a laser scan—which may e.g. comprise a 3D-point cloud as well as added 2D-image data provided by a camera of a laser scanner-, another based on a PID, are provided in a comparable format and the two topologies are correlated wherein detected and interrelated structural elements in both topologies are interlinked.

Optionally, the established correlation is used to provide a visual model such as a 2.5D- or 3D-representation of the plant, wherein the visual plant model is based on scan data of the spatial scan, e.g. a point cloud, and comprises visual representations of identified and interlinked structural elements. Optionally, the visual model is adapted to augmented reality visualization.

Preferably, the visual model comprises screen hot spots. These hot spots enable user access to a database with data of a respective structural element, wherein the access is enabled by the established interlinkage of elements of the first and second topology as described above, thereby using a respective structural element's PID-tag provided by the PID. For example, a model is displayed by a touch screen and a user can touch on a respective displayed structural element, having a screen hot spot which is visually marked with the PID-label of the element, therewith opening a window or menu with database information of PID-entries and many other structural and engineering information such as structural element's type, manufacturer, manufacturing date and/or inspection date relating to this element resp. PID-label.

Optionally, providing the first and the second digitalized topology comprises generation of a first and a second interconnection graph, a respective graph representing a logic of the interconnections of the structural elements, and correlating the topologies comprises matching of the interconnection graphs.

Alternatively or additionally, providing the second digitalized topology comprises processing of a non-digitalized process and instrumentation diagram, wherein optionally in course of the processing of the non-digitalized process and instrumentation diagram structural elements' symbols, tags or labels and interconnections in the non-digitalized process and instrumentation diagram are automatically detected or recognized and tags are interlinked to their relating detected structural element.

As a further option, an additional data source with additional data about the plant structure is used for supporting the step of providing a second digitalized topology and/or supporting the step of correlating the first and second digitalized topology. For example, a so called piping isometry of the plant as additional data source is considered when deriving the second topology or when correlating the two topologies. Taken such further information about the plant resp. its structural elements and interconnections can improve the robustness and/or speed of the procedure.

As another option, providing the second topology comprises automatic combination of at least two process and instrumentation diagrams of the plant using their off-page-connectors and/or providing the first topology comprises combination of at least two spatial scans.

Optionally, the method comprises automatic detection, and as a further option also adjustment, of inconsistencies or discrepancies and/or ambiguities between the first and second digitalized topology. In addition, a discrepancy and/or ambiguity prompt is optionally generated for enabling manual adjustment by a user, visually presenting information such as localization or type of the deficiency. The prompt can be included in a visual model of the plant.

As a further option, user selectable propositions for adjustment of a detected deficiency are automatically generated, wherein optionally for the automatic generation vacant or untaken or available structural elements' tags or labels are considered, the structural elements' tags or labels as provided by the digitalized process and instrumentation diagram. Thus, a user can select from multiple options as provided by the computer program to heal any error in the topologies. Additionally or alternatively, a side-by-side view or visualization of the first and second topology with highlighted discrepancies and/or ambiguities is provided, facilitating manual correction of the topologies resp. the plant model.

As another option, identifying and interlinking corresponding structural elements comprises manually, automatically or semi-automatically searching for, identifying and interlinking of at least one starting correlation structural element. The at least one starting correlation structural element is a structural element with utterly unambiguous correspondence, hence correspondence of this structural element in the first and second topology is undoubted. The starting element serves as a starting or anchor point for identifying and interlinking of further structural elements.

As a PID generally comprises information about flow directions of the plant or process, the second digitalized topology which is based on the plant PID, comprises optionally data about process flow directions of interconnections. As a further option, the flow directions data is considered for correlating the first and second topology and/or is visualized in a plant visual model as generated based on correlated first and second digitalized topology.

Some embodiments further relate to a computer program product for generation of information enhanced plant model, the computer program product having program code which is stored on a machine-readable medium or embodied as an electromagnetic wave, the program code being configured to control and carry out the method as described above.

BRIEF DESCRIPTION OF THE DRAWINGS

The invention is in this case furthermore described in greater detail purely by way of example below on the basis of concrete exemplary embodiments illustrated schematically in the drawings, further advantages of the invention also being discussed.

Specifically.

DETAILED DESCRIPTION

Figure 1A:
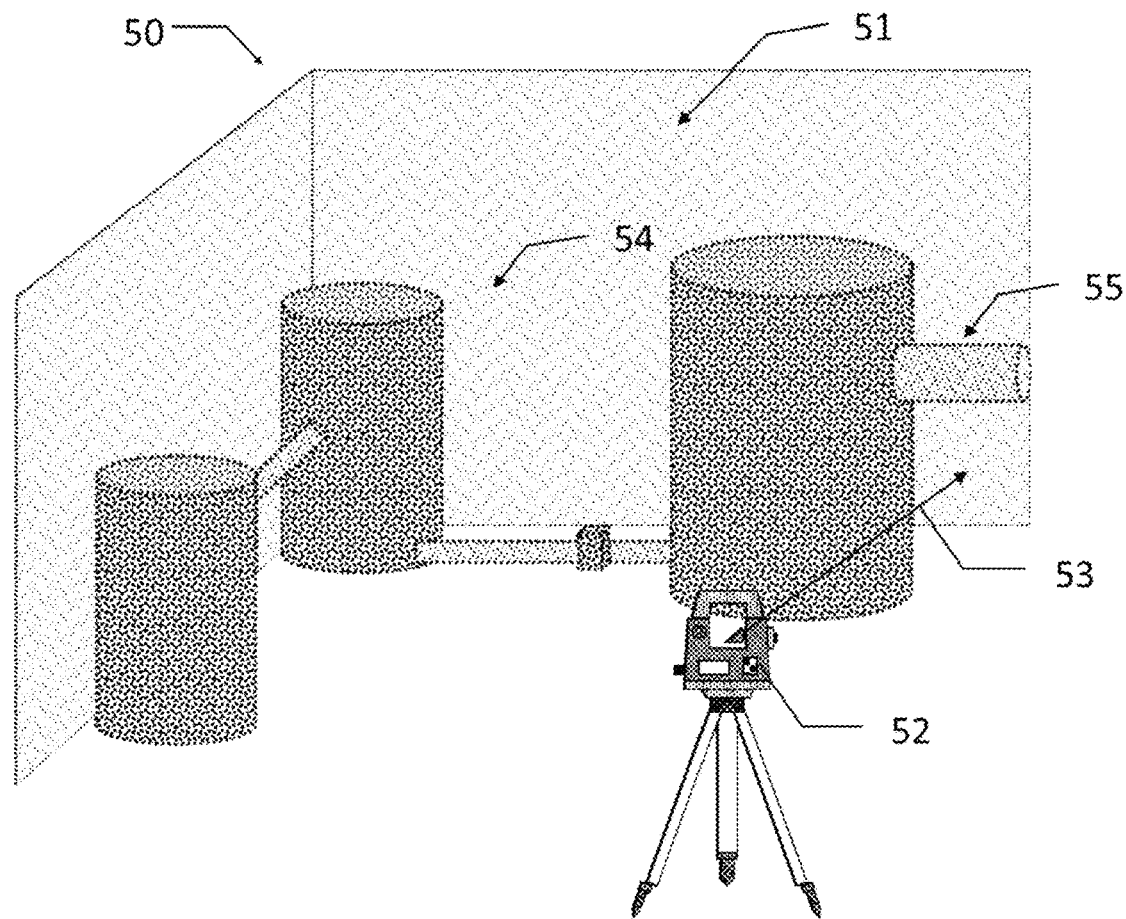
FIGS. 1a,b show an example for providing a first digitalized topology based on a spatial scan.
Figure 1B:
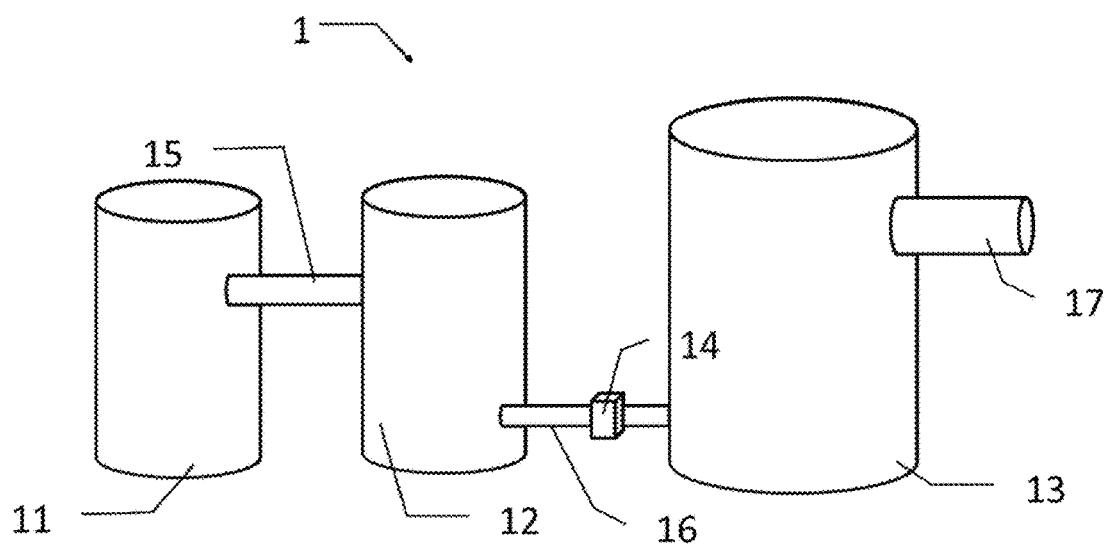

FIGS. 1a and 1b show an example for providing a digitalized topology of a plant out of a spatial scan.

In the example according to FIG. 1a, a spatial scan of a plant or factory 50 is generated by scanning the plant 50 with a laser scanner 52, emitting a measurement beam 53 at the plant 50 respectively its objects, for example vessels 54 and pipes 55 as indicated in FIG. 1a. Other possibilities for spatial scanning are known to the skilled person. For reasons of simplicity or clearness, only a very small plant 50 resp. only a very small plant part is illustrated, however, the present method is suitable or rather dedicated for complex or huge plants, having a high number of objects 54, 55.

As known in the art of spatial scanning, a point cloud 51 is established therefrom, indicated in FIG. 1a by the doted texture of the objects 54, 55. The scan data resp. the point cloud 51 gives three-dimensional or spatial information about the plant surface(s). As an additional option and as known in the art, too, (two-dimensional) image data, provided by a camera of laser scanner 52, can be added to the scan data. As a further option, multiple scans of the plant 50, e.g. taken at multiple stationing of the laser scanner 52 are combined as part of the method.

Next, the scan data 51 is processed to provide a digitalized topology 1 of plant 50 (in the present context the first topology). The processing of the scan data 51 is such that objects or more precisely elements 54, 55 of the plant 50 being part of its (functional) structure such as vessels, pipes, valves, switches and so on are recognized and digitalized. In the present example, vessels 11, 12 and 13 are derived together with their interconnection pipes 15, 16 and 17 and the valve 14 at pipe 16 resp. in between vessels 12 and 13. By digitalization, these structural elements 11-14 are provided as digital objects with known interconnections 15-17, thus forming the first digitalized topology 1. The spatial relationship of the structural elements 11-17 which in principle is available due to the scan data 51 is not necessarily mapped in the topology 1 (indicated in FIG. 1b in that the arrangement of elements 11-17 is not exactly the same as of the objects 54, 55 in FIG. 1a) as not the spatial but the functional relationship is essential for first topology 1. The first topology 1 establishes a first operative and optionally geometric relationship of the plant elements from a spatial scan of the plant.

Figure 2:
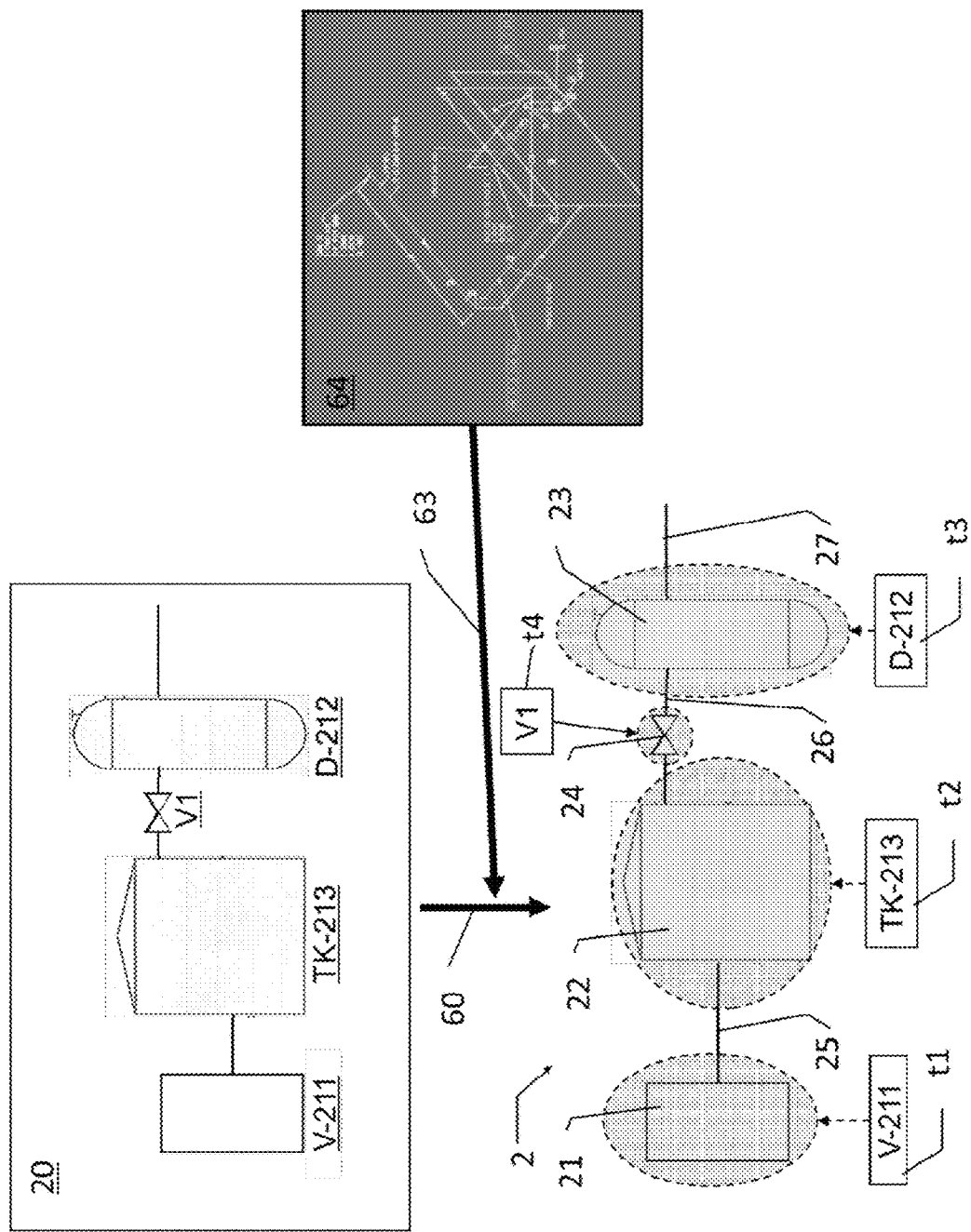
FIG. 2 shows an example for providing a second digitalized topology based on a PID.

FIG. 2 shows an example for providing a second topology 2 of the plant or workshop, based on a process and instrumentation diagram (also known in the art as pipes and instrumentation diagram), in the following abbreviated as PID. Again, only a very simple PID is shown for reasons of comprehensibility. As an option and in difference to this simple example, as part of the method, two or more PIDs are combined using their off-page connectors (OPCs).

In the example, the second topology 2 is generated out of a digital or non-digital PID 20, for example a digital PID in form of a pdf-file (portable document file). The PID 20 shows three elements, their interconnections as well as their labels or tags.

The digital PID 20 is processed (arrow 60) such that the respective structural elements and their interconnections are recognized and stored as separate data objects together with the respective labels. Hence, in the example according to FIG. 2, vessels 21, 22 and 23 are derived, together with their logical connections 25, 26 and 27 and valve 24 located at connection 26. In addition, tags t1, t2, t3 and t4 are recognized and associated with their related structural elements 21-24.

Therefore, a second digitalized topology 2 is formed, having digitalized information about the structure and tagging of the plant according to the underlying PID. The processing can optionally be supported by a digital dictionary of symbols to be detected in the PID 20, the PID-dictionary providing e.g. types and shapes to be identified. The second topology 2 establishes a second operative and optionally geometric relationship of the plant element from a PID 20 of the plant.

FIG. 2 symbolizes on the right also a further option for the step of generation of the second topology 2. The generation of the second topology 2 is optionally assisted (indicated by arrow 63) by using the data of a data source 62 with data about the plant other than the PID 20. For example, data about the geometric or spatial arrangement of the structural elements or the interconnections such as given by a plant piping isometry 64 is used in addition to the PID-data for providing the second topology 2, the second topology then being derived from combined PID-data and piping isometry data.

The digitalization 60 is performed such that the digitalized PID data is conforming to the digitalized data of the spatial scan. In other words, the second topology 2 is provided in a digitalized form assimilable to the first topology 1, enabling correlation of the first and second digitalized topology 1, 2 as will be explained with respect to FIG. 3.

Figure 3:
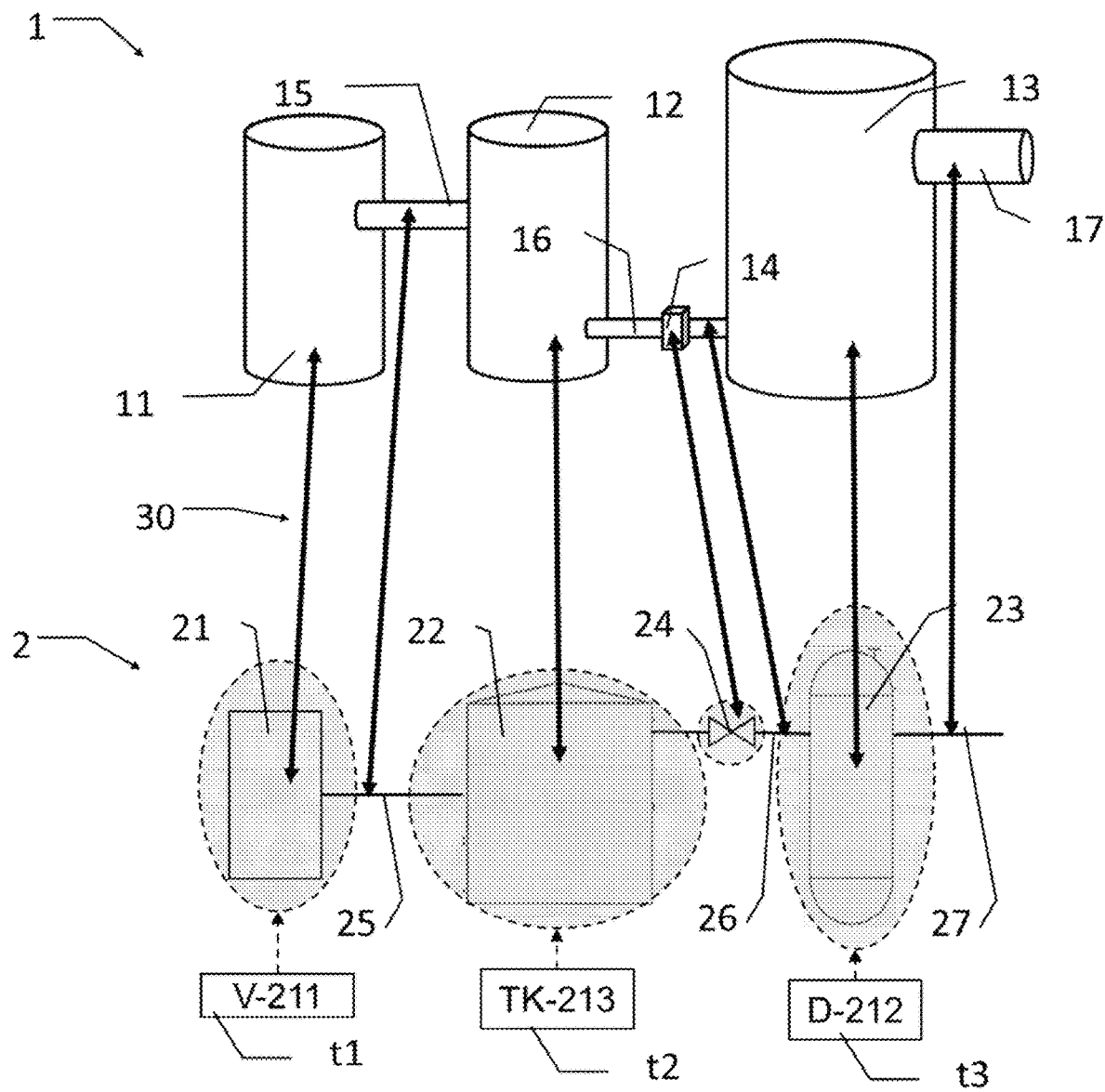
FIG. 3 shows an example for correlation of the first and second topology.

FIG. 3 shows in an exemplary way of correlating the first and the second digitalized topology 1, 2. Corresponding structural elements as well as their interconnections are identified and interlinked (symbolized by arrow 30), i.e. PID-vessel 21 is identified as corresponding to the scan-element 11, PID-tank 22 is identified as corresponding to scan-element 16, PID-interconnection 25 is identified as corresponding to pipe 15 and so on. Structural elements 11-14 provided by the first topology 1 and structural elements 21-24 provided by the second topology 2 identified as belonging together or agreeing are interlinked 30.

As an option (not shown in FIG. 3), the step of identifying and interlinking of corresponding plant structure is supported by using an additional data source about the plant structure other than the PID-data and scan data. For example, information given by a piping isometry (symbol 64 in previous FIG. 2) is considered to improve or facilitate the correlation of first and the second topology 1, 2.

Hence, according to the described method, PID-data, e.g. element name or tag t1-t4 of a structural element such as valve 24 can be assigned to its scan-based counterpart 14. Pairing structural elements 11-17 and 21-27 resp. correlating the first and second topology 1, 2, couples technical and "theoretical" PID-information or data to relating scan data, the scan data representing spatial "real-world" information of plant objects.

Said otherwise, generation of a first topology 1 based on a spatial scan and of a second topology 2 based on a PID, both topologies 1, 2 descriptive of the plant functional or operational structure and its structural elements 11-14, 21-24 and both topologies 1, 2 provided in a form or format comparable to each other, is used to couple PID-information of a structural element 21-24 to its "spatial" counterpart 11-14, at least a respective element's tag t1-t4. Preferably, the established coupling or interlinkage serves to link further information or data to a respective structural element as will be explained in more detail below.

The above described pairing or identification and interlinking 60 of structural elements 11-17, 21-27 of the first and second digitalized topology 1, 2 resp. the correlation of the first and second digitalized topology 1, 2 is done in an automatic or at least semi-automatic way. Automatic means that the correlation is performed by a computer program code or algorithm without user actions. Semi-automatic means that the computer is supported by a user. Examples for such user assisted identifying and interlinking of correspondences are given in the following figures. Thus, the method, or at least those parts of it which involve computation, can also be embodied as a computer program product that is stored on a machine readable medium or embodied as electromagnetic wave (such as wired or wireless data signal).

Figure 4A:
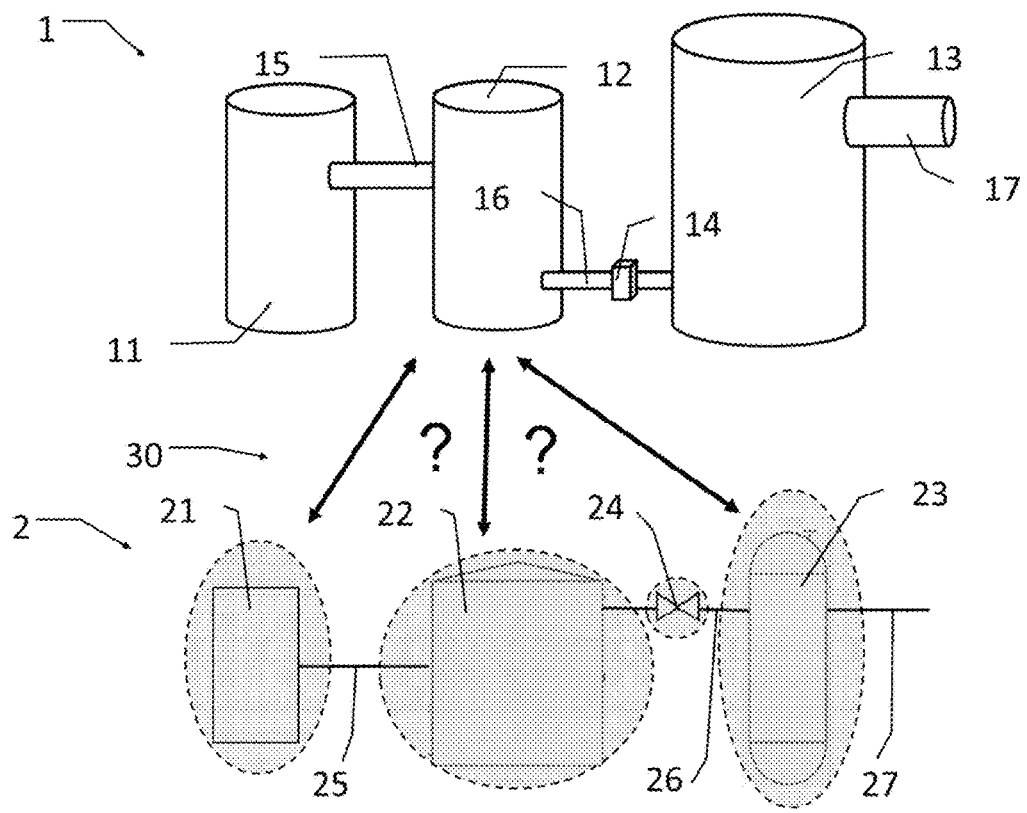
FIGS. 4a-5 show further examples for correlation of the first and second topology.
Figure 4B:
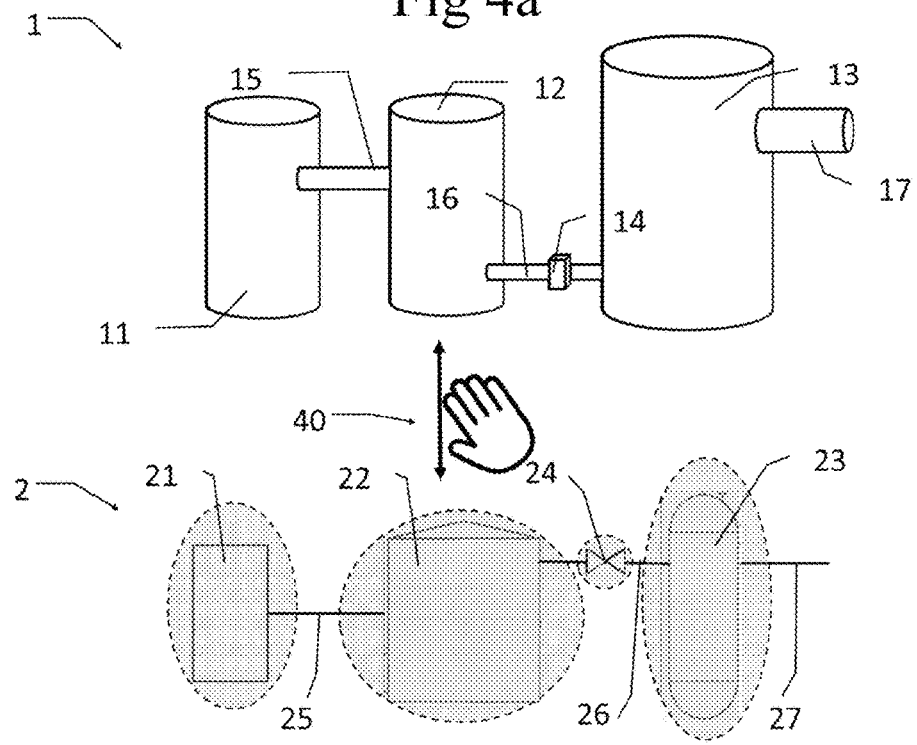
Figure 4C:
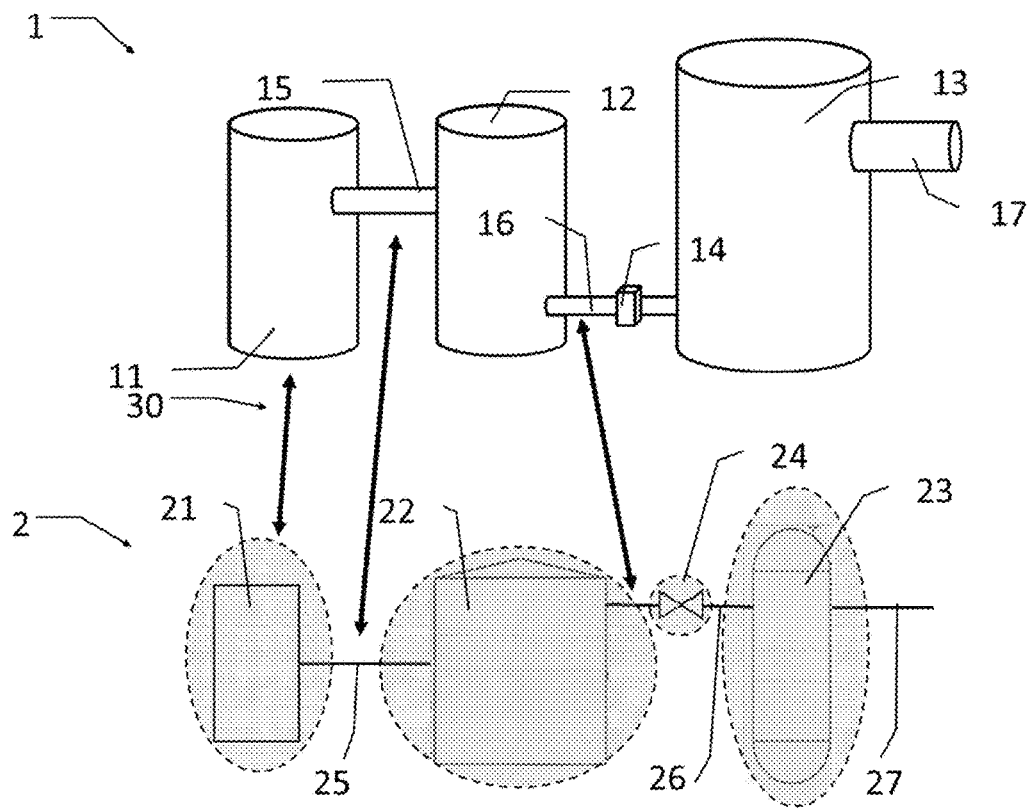

FIGS. 4a-c show an example for semi-automatic correlation of the first and second digitalized topology 1, 2. A reason for not full automatisation might for example by the complexity of a plant wherefore it might be difficult to identify corresponding structural elements from the beginning with sufficient certitude. As shown in exemplary FIG. 4a, e.g. element 12 of the first topology 1 cannot be identified and interlinked unambiguously to one of the elements 21-23 of the second topology 2 by the computer.

In FIG. 4b, it is illustrated that PID-element 22 is assigned to scan-element 12 by a user (symbolized by arrow 40). For manual assignment 40 optionally a side-by-side view of both a visualization of the first topology 1 and of the second topology is shown on a display, as indicated in FIG. 4b. As a further option, ambiguities or inconsistencies or errors are visually highlighted in a view of the plant.

Such a manual correlation is optionally supported by the computer program in that possible identifications or solutions for an ambiguity are proposed to the user from which the user can select the right one, e.g. in form of a drop-down-menu or prompt. E.g. in the example, the program might suggest structural elements 22 and 23 for assignment to element 12 of the first topology or vice versa might suggest first elements 11 and 12 as probably fitting to element 21 of the second topology 2.

Such an automated generation of selectable propositions for adjustment of ambiguities can be based on still available or vacant PID-tags. Said otherwise, the propositions are taken from yet untaken PID-labels, whereby a further automatic selection among this lot can be done according to further parameters such as logic criteria with respect to the plant structure, or vice versa.

In the present example however, such a label-based proposition is not effected as the correlation is at the very beginning and the procedure serves for identifying a first or starting structural element 12 resp. 22 for subsequent correlation of the other elements 11, 13, 14, 21, 23, 24. The starting element 12, 22 or starting linking 40 serves as an anchor point or germ from which further identification evolves. As such, an element is searched for and selected having utterly unambiguous correspondence.

FIG. 4c illustrates the next step of identifying and interlinking further elements 11, 21 and interconnections 15, 25, 16, 26, using the knowledge of the starting linkage of elements 12 and 22.

Searching, identifying and interlinking of a starting element is done manually by a user as depicted in FIG. 4b, but can alternatively also be done in an automatic fashion, based on the condition of finding a completely unambiguous correlation.

Figure 5:
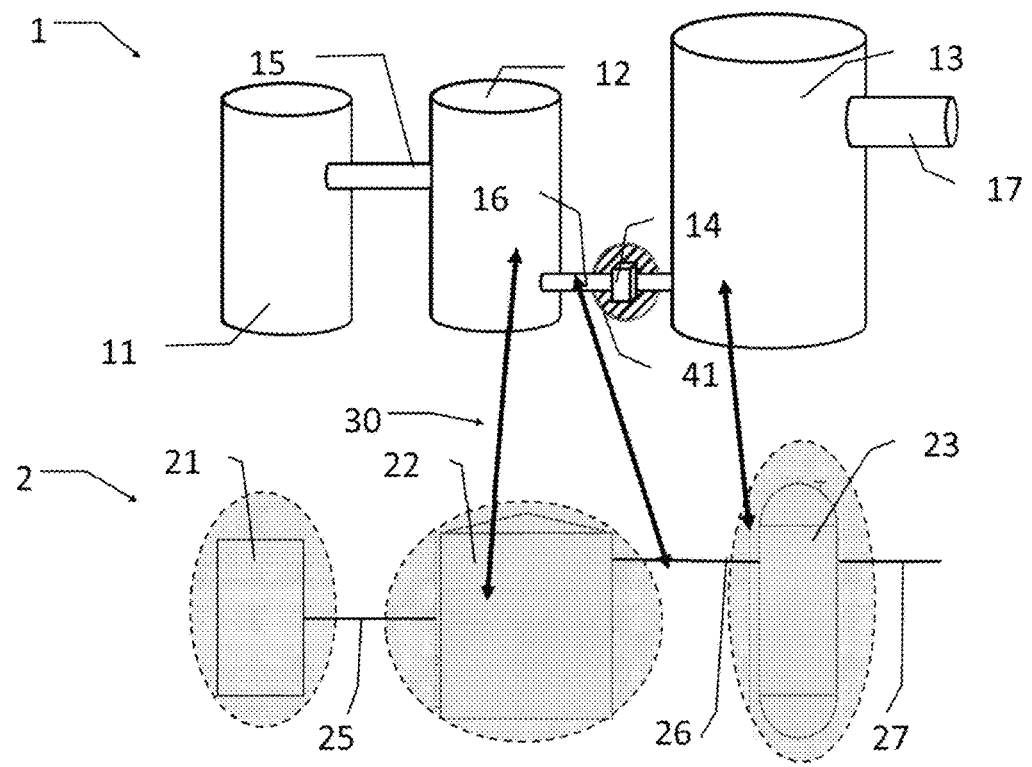

FIG. 5 illustrates a further option. Besides or additionally to above described automatic detection and (semi-)manual adjustment of ambiguities, inconsistencies or discrepancies are revealed as part of the method. In the example, (at least) structures 12, 13 and 16 are interlinked to their corresponding structures 22, 23 and 26. However, analysing the scan data resulted in an additional element 14 as part of the first topology 1. No (possible) correspondence for this additional element 14 can be identified. A reason for such an inconsistency is e.g. later implementation of a valve 14 in pipe 16 without accordingly updating the plant PID.

This discrepancy is automatically detected and for example visually highlighted in a model or visual representation of the plant as indicated in FIG. 5 by marking 41. This serves optionally as basis for manual adjustment of the discrepancy, i.e. the user can enter the element manually into the model resp. topology or digitalized PID. Alternatively or additionally, if the scan data allows for automatic identification of the additional object 14, i.e. recognizing it as a valve, automatic insertion of structural element 14 is performed.

Figure 6:
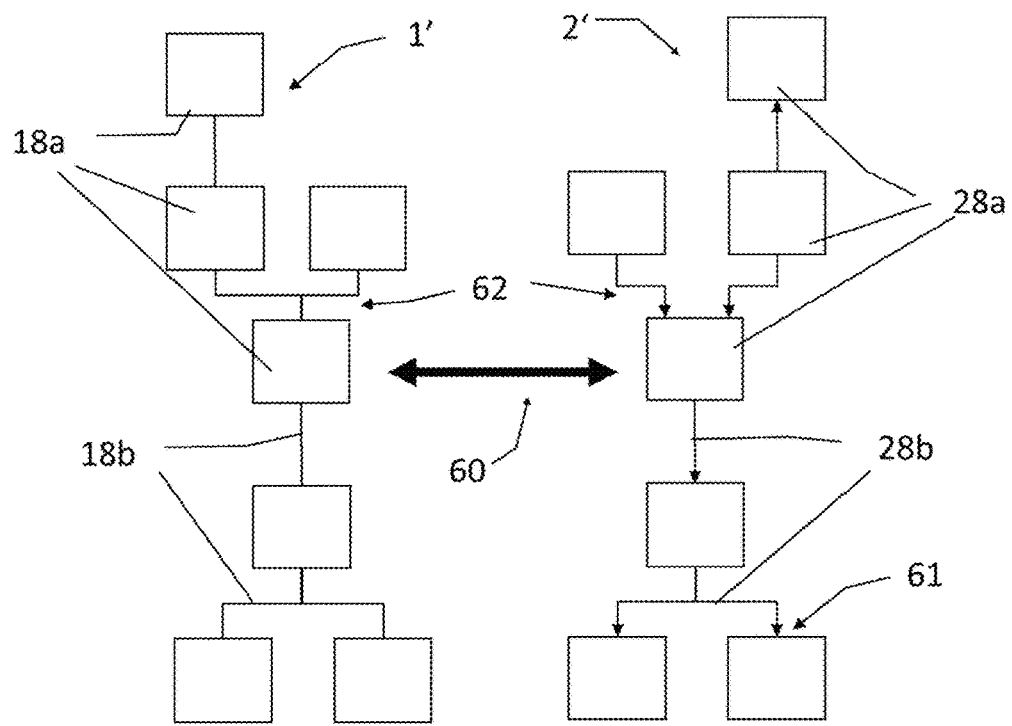
FIG. 6 shows another example for correlation of a first and second topology.

FIG. 6 shows another example of correlation of a first digitalized topology of the plant and a second topology. In the example, a first topology 1' is digitalized out of a spatial scan of the plant in form of a first digitalized interconnection graph 1'. The structural elements 18a as well as their connections 18b are derived from the scan data and converted in a graph 1', having the structural arrangement or interlinkage of the plant elements 18a.

Likewise, a second digitalized topology 2' in form of a second and similar digitalized interconnection graph 2' is generated from the plant PID, having structural elements 28a and their interconnections 28b. Different to the first graph 1', the second interconnections 28b of the second graph 2' not only represent the elements' connection but the flow direction 61, too (indicated in the figure by arrows). The flow direction 61 between the structural elements resp. of the plant processing is provided by the PID.

The interlinkage and correlation is in this example done by matching of the first and second digitalized interconnection graph 1', 2' (indicated by arrow 60 in FIG. 6). Thereby, the flow directions 61 known from the underlying PID are optionally used in the correlation resp. matching procedure as additional constraints and/or for verification of the matching resp. correlation. For example, the known flow directions 61 can be used to correct the discrepancies of interconnections 18b and 28b as pointed to in FIG. 6 by arrows 62 resp. dissolve the interconnection ambiguity and automatically decide, which interconnection variant (the one of the first graph 1' or the one of the second graph 2') is the correct one.

Figure 7:
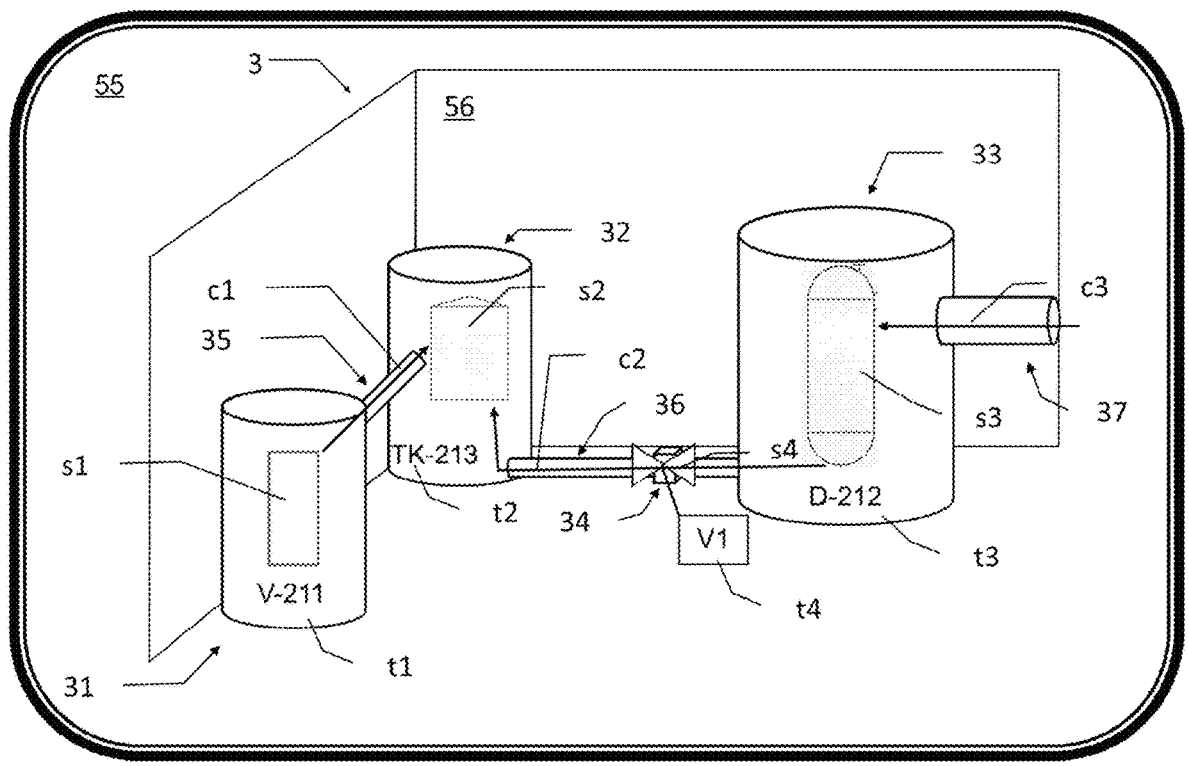
FIG. 7 shows an example for visualization of an information enhanced plant model.

FIG. 7 shows an example of providing a visual model or visual representation 3 of the plant, using correlated first and second digitalized topology 1, 2. Using a display 55, for example of a tablet or other portable device, the model 3 is displayed to a user in a 3D-view, showing the model structural elements 31-34 together with the visualized connecting elements (pipes) 35-37. The model 3 is basically generated using the scan data or the point cloud provided by the spatial scan and shows visual representations of the structural elements 31-34 as well as a visual representation of their surrounding (e.g. walls 56).

According to the invention, the scan based visualisation is enhanced in that PID-data of the structural elements 31-34 are integrated or inserted which is enabled by the previous correlation of the first and second topology 1, 2. In the example, the model 3 provides element models 31-34 comprising a scan-based 3D-view, overlayed with the associated PID-symbol s1-s4 as well as the associated PID-labels t1-t4 and the respective interconnections c1-c3. In the example, the interconnections c1-c3 also represent the plant process flow direction as provided by the underlying PID. For example, element 32 is displayed as a 3D-object, optionally overlayed or textured using a camera picture as mentioned above, together with the associated PID-symbol s2 ("tank"), the label t2 ("TK-213") and the interconnections c1 to vessel 31 and c2 to vessel 33. Optionally, the model 3 is adapted to be displayed by an augmented-device such as AR-glasses, enabling a view of the plant augmented with PID-data.

Such a view or model 3 of the plant visualizes a fusion of measured spatial or 3D-information about the plant with information of the plant PID. Advantageously, the technical and graphical, rather abstract information of a PID is tied to a "real-world-view" of the plant, enabling quick user orientation about the structure of the plant and identification of element type by symbols s1-s4 and of an individual element by the displayed element tag t1-t4.

Figure 8:
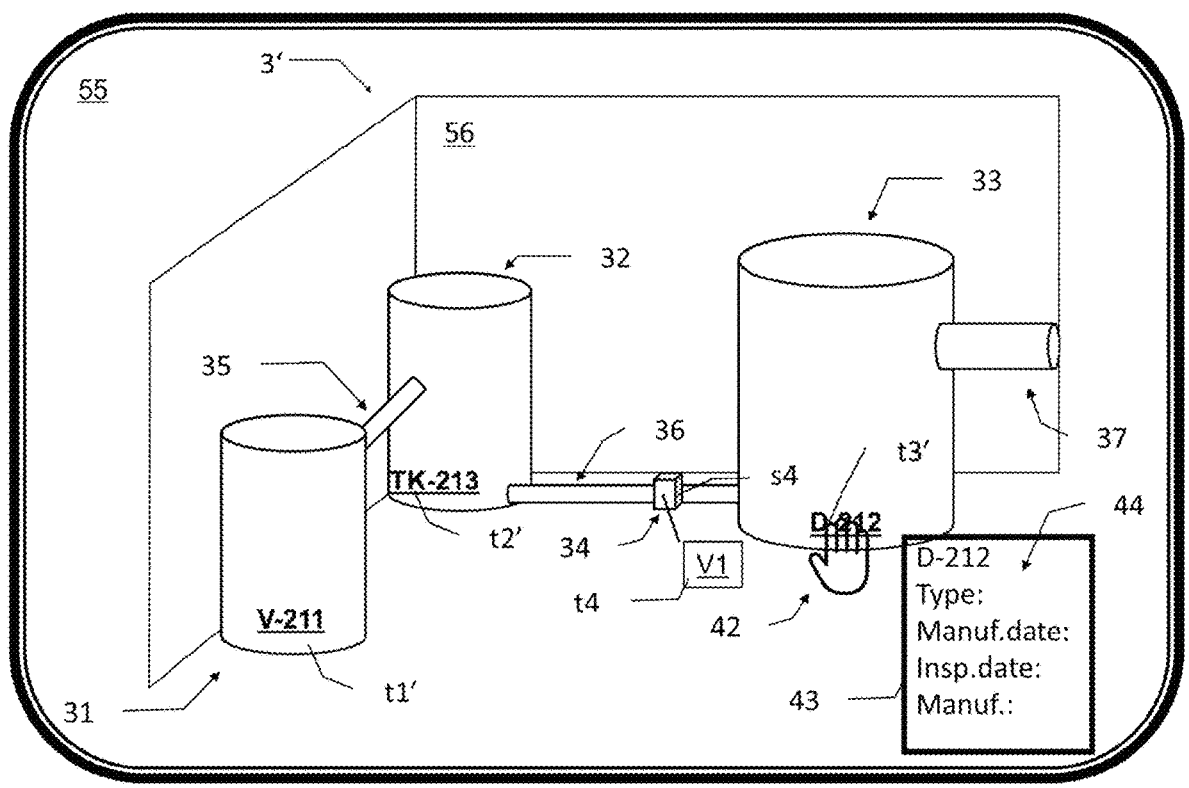
FIG. 8 shows another example for visualization of an information enhanced plant model.

FIG. 8 shows an alternative visual model 3' of the plant displayed on a display 55. In contrast to the visualisation 3 according to FIG. 6, PID-symbols are not displayed resulting in a clearer view. Especially in very complex structures, displaying of a lot of graphics risks cluttering the display.

Instead, the visual representation comprises screen hot spots integrated in tags t1'-t3' whereby the tags or hot spots t1'-t3' may be explicitly displayed as shown in the figure or might be hidden for an even more clear view of the spatial information. In case of a screen manipulable with a computer mouse, the pointer may for example change to a hand symbol 42 when nearing hot spot t3' as shown in FIG. 7.

By clicking or activating the hot spot t3', a user accesses a database with data of a respective structural element such as element 33 shown in the example, the element 33 labelled by its corresponding PID-tag t3'. In the example, a window 43 is opened presenting database data 44 of element 33 named D-212. The database contains for example the type of element, its manufacturer, production date, date of (last) inspection, its interconnections to other elements 31, 32, 34, and so on. By accessing the database, additional graphical information relating to the chosen structural element 33 may optionally be displayed such as a PID-symbol s1-s3 or data about its health (cf. FIG. 7).

A skilled person is aware of the fact that details, which are here shown and explained with respect to different embodiments, can also be combined in other permutations in the sense of the invention if not indicated otherwise.

What is claimed is:

1. A method of generating an information enhanced plant model, the method comprising:
providing a first digitalized topology of a plant out of a spatial scan of the plant by processing the spatial scan of the plant, whereby the processing is such that plant structural elements and their interconnections are recognized and digitalized, whereby by the digitalization, these structural elements are provided as digital objects with known interconnections, thus forming the first digitalized topology, the first digitalized topology establishing a first operative relationship of the plant structural elements from the spatial scan, whereby scan data of the spatial scan gives three-dimensional (3D) information about the plant surfaces, having two-dimensional camera image data added;
providing a second digitalized topology of the plant, based on a process and instrumentation diagram of the plant, the second topology being representative of plant structural elements and their interconnections, the second digitalized topology establishing a second operative relationship of the plant structural elements from the process and instrumentation diagram, wherein the second digitalized topology is provided in a comparable format to the first topology; and
correlating the first and the second digitalized topology by at least semi-automatically identifying and interlinking corresponding structural elements in the first and second digitalized topology.

2. The method of claim 1, further comprising:
providing a plant visual model based on the spatial scan, the visual model comprising visual representations of identified and interlinked structural elements.

3. The method of claim 2, wherein the visual model comprises screen hot spots enabling user access to a database comprising data of a respective structural element, wherein the access is enabled by the interlinkage of corresponding structural elements, thereby using a respective structural element's tag of the process and instrumentation diagram.

4. The method of claim 3, wherein the data of the database:
comprises process and instrumentation diagram data, or
is descriptive of at least one of a respective structural element's type, health, manufacturer, manufacturing date or inspection date.

5. The method of claim 1, wherein:
providing the first and the second digitalized topology comprises generation of a first and a second interconnection graph, a respective graph representing a logic of the interconnections of the structural elements, and
correlating the two topologies comprises matching of the interconnection graphs.

6. The method of claim 1, wherein providing the second digitalized topology comprises processing a non-digitalized process and instrumentation diagram.

7. The method of claim 1, wherein an additional data source with additional data about the plant structure is used for supporting the step of providing a second digitalized topology or supporting the step of correlating the first and second digitalized topology.

8. The method of claim 1, wherein providing the second topology comprises an automatic combination of at least two process and instrumentation diagrams of the plant using their off-page-connectors or providing the first topology comprises combination of at least two spatial scans.

9. The method of claim 1, wherein an automatic detection of discrepancies or ambiguities between the first and second digitalized topology is performed in the course of correlating the first and the second digitalized topology.

10. The method of claim 9, wherein a discrepancy or ambiguity prompt is generated for enabling manual adjustment by a user.

11. The method of claim 1, wherein identifying and interlinking corresponding structural elements comprises searching for, identifying, and interlinking of at least one starting correlation structural element, the at least one starting correlation structural element:

being a structural element with unambiguous correspondence, and serving as a starting point for identifying and interlinking of further structural elements.

12. The method of claim 1, wherein the second digitalized topology comprises data about process flow directions of interconnections.

13. The method of claim 12, wherein the flow directions data:

is considered for correlating the first and second topology, or is visualized in a plant visual model, the plant visual model combining scan data and process and instrumentation diagram data.

14. The method of claim 1, wherein the spatial scan is generated by a laser scanner and comprises a three-dimensional (3D) point cloud and two-dimensional (2D) image data provided by a camera of the laser scanner.

15. A computer program product for generation of information enhanced plant model, the computer program product having program code which is stored on a non-transitory machine-readable medium, the program code being configured to control and carry out a method comprising:

providing a first digitalized topology of a plant by processing a spatial scan of the plant, wherein in course of the processing, plant structural elements and their interconnections are recognized and digitalized, providing a second digitalized topology of the plant, based on a process and instrumentation diagram of the plant, the second topology being representative of plant structural elements and their interconnections, wherein the second digitalized topology is provided in a comparable format to the first topology; and correlating the first and the second digitalized topology by at least semi-automatically identifying and interlinking corresponding structural elements in the first and second digitalized topology.

* * * * *